(12) United States Patent  
Kim

(10) Patent No.: US 7,763,930 B2
(45) Date of Patent: Jul. 27, 2010

(54) SEMICONDUCTOR DEVICE AND MANUFACTURING METHOD THEREOF

(75) Inventor: Sung Jin Kim, Geumjeong-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 427 days.

(21) Appl. No.: 11/847,090

(22) Filed: Aug. 29, 2007

(65) Prior Publication Data

US 2008/0054333 A1 Mar. 6, 2008

(30) Foreign Application Priority Data

Aug. 29, 2006 (KR) .................. 10-2006-0082457

(51) Int. Cl.
*H01L 29/78* (2006.01)
*H01L 21/36* (2006.01)

(52) U.S. Cl. ...................... 257/315; 438/264

(58) Field of Classification Search .................. 438/40, 438/254, 494, 498, 634, 669, 673, 924, 940, 438/264, 246, 242, 268–274, 185, 371–375; 257/315, E21.214–E21.316, 111, 244, 328–333, 257/466, 513, 594

See application file for complete search history.

(56) References Cited

U.S. PATENT DOCUMENTS

| 7,241,659 B2* | 7/2007 | Hung et al. | 438/242 |
| 7,427,545 B2* | 9/2008 | Cheng et al. | 438/243 |
| 2001/0012673 A1* | 8/2001 | Gyu-chul | 438/373 |
| 2002/0004271 A1* | 1/2002 | Weis | 438/243 |
| 2005/0035389 A1* | 2/2005 | Bulsara et al. | 257/301 |
| 2008/0199997 A1* | 8/2008 | Grebs et al. | 438/270 |

* cited by examiner

*Primary Examiner*—Dao H Nguyen
*Assistant Examiner*—Tram H Nguyen
(74) *Attorney, Agent, or Firm*—Saliwanchik, Lloyd & Saliwanchik

(57) ABSTRACT

Provided are a semiconductor device and a manufacturing method thereof. A pair of adjacent gate structure can be formed on a substrate. Mask patterns exposing a portion located between the gate structures are formed. The substrate portion located between the gate structures can be etched using the mask patterns as an etch mask to form a pocket. First conduction type impurities can be implanted into the pocket to form a first impurity layer in a surface of the pocket. Second conduction type impurities can be implanted into the pocket to form a second impurity layer on the first impurity layer. The pocket can be filled with an insulating material. Accordingly, impurities having a type opposite to the type of source junction impurities are implanted into the pocket to reduce a potential barrier of a source junction. Consequently, punch-through generated between a source and a drain can be inhibited.

9 Claims, 5 Drawing Sheets

SEMICONDUCTOR DEVICE AND MANUFACTURING METHOD THEREOF

CROSS-REFERENCE TO RELATED APPLICATION

The present application claims the benefit under 35 U.S.C. §119 of Korean Patent Application No. 10-2006-0082457, filed Aug. 29, 2006, the subject matter of which is hereby incorporated by reference.

BACKGROUND

With developments in semiconductor manufacturing process technology many limitations in miniaturization and integration of memory devices and non-memory devices exist. Particularly, as the design rule for semiconductor devices rapidly reduces, punch-through phenomenon between a source and a drain is frequently generated to cause a great limitation in operation characteristics and performance characteristics of the semiconductor devices.

In detail, in the case of flash memory miniaturization is particularly in rapid progress. Reduction in an effective channel length of a flash memory device improves not only integration degree but also performance.

That is, when the effective channel length reduces in the flash memory device, a program operating speed is remarkably improved due to an increase in efficiency of carriers injected into a floating gate forming a flash memory cell.

However, when the effective channel length is reduced in the flash memory device, a drain depletion region extends to merge with a depletion region of a source. Accordingly, a punch-through phenomenon between the source and the drain may occur.

Consequently, when the effective channel length is reduced in a flash memory device, a threshold voltage of a cell greatly reduces and has a great influence on the operation characteristic of the flash memory cell.

BRIEF SUMMARY

In one embodiment, a semiconductor device includes: a pair of adjacent gate structures disposed on a substrate; a pocket formed in a common source region between the gate structures; a first conduction type impurity layer formed in a surface of the pocket; a second conduction type impurity layer formed in a surface of the first conduction type impurity layer; and an insulating material filling the pocket.

In another embodiment, a method for manufacturing a semiconductor device, includes: forming a pair of adjacent gate structures on a substrate; forming mask patterns exposing a portion located between the gate structures; etching the portion located between the gate structures on the substrate using the mask patterns as an etch mask to form a pocket; implanting first conduction type impurities into the pocket to form a first conduction type impurity layer in a surface of the pocket; implanting second conduction type impurities into a surface of the first conduction type impurity layer to form a second conduction type impurity layer on the first conduction type impurity layer; and filling the pocket with an insulating material.

Other systems, methods, features and advantages will be, or will become, apparent to one with skill in the art upon examination of the following figures and detailed description. Nothing in this section should be taken as a limitation on those claims. Further aspects and advantages are discussed below in conjunction with the embodiments.

DETAILED DESCRIPTION

Reference will now be made in detail to embodiments of the present disclosure, examples of which are illustrated in the accompanying drawings.

Figure 1:
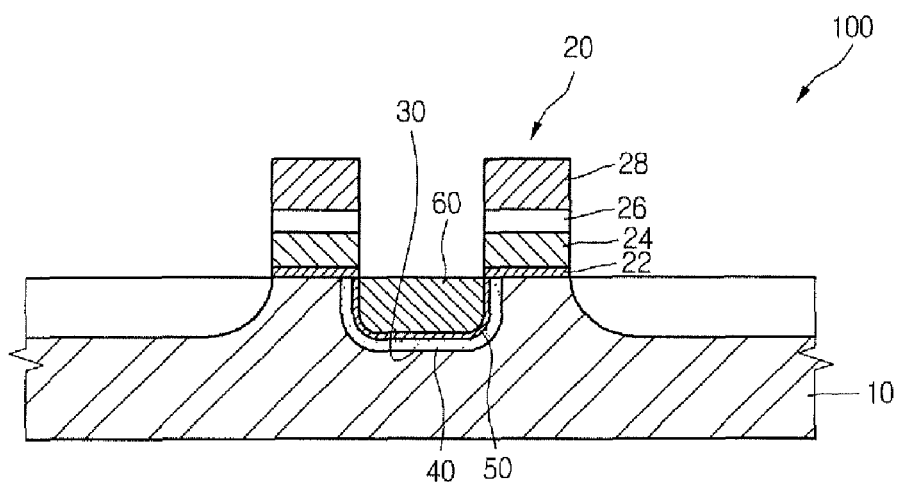
FIG. 1 is a cross-sectional view of a semiconductor device according to an embodiment of the present invention.

FIG. 1 is a cross-sectional view of a semiconductor device according to an embodiment of the present invention.

Referring to FIG. 1, the semiconductor device 100 includes gate structures 20, a pocket 30, a first conduction type impurity layer 40, a second conduction type impurity layer 50, and an insulating material 60 formed in the pocket 30.

In an embodiment, the semiconductor device 100 can be, for example, a NOR flash memory that can store data using programming and erasing operations.

The gate structures 20 can be formed on a substrate 10. In an embodiment, the gate structures 20 are adjacently disposed in pairs on the substrate 10. The substrate 10 can be a p-type silicon substrate doped with p-type impurities.

The gate structures 20 include a tunnel oxide layer pattern 22, a floating gate 24 disposed on the tunnel oxide layer pattern 22 and in which carriers are stored or discharged, an ONO pattern 26 disposed on the floating gate 24, and a control gate 28 disposed on the ONO pattern 26.

A common source region is formed between a pair of the gate structures 20 formed on the substrate 10. Drain regions are formed in regions outside of the pair of the gate structures 20. A gate channel is formed below each gate structure 20.

In one embodiment, the tunnel oxide layer pattern 22 has a thickness of about 93 Å, the ONO pattern 26 has a thickness of about 147 Å, the junction depth is about 0.11 μm, the gate channel has a length of about 0.187 μm, and the effective channel length is about 0.08 μm. The above-described values of the gate structure are used in a simulation of a semiconductor device according to an embodiment.

Referring again to FIG. 1, a pocket 30 is formed in the common source region disposed between the pair of the gate structures 20. The pocket 30 formed in the common source region can have a groove shape formed by etching a portion of the common source region.

The first conduction type impurity layer 40 is formed in the surface of the pocket 30. In an embodiment, the first conduction type impurity region 40 includes p-type impurities. In one embodiment, $BF^+$ ions can be implanted into the surface of the pocket 30 to form the first conduction type impurity layer 40.

In the embodiment, the number of the first conduction type impurities contained in the first conduction type impurity layer 40 is very important because a punch-through phenomenon is difficult to control when the number of the first conduction type impurities is too large or too small. Accordingly, the number of the first conduction type impurity ions is in a range of $4 \times 10^{15}$-$6 \times 10^{16}$ atoms/cm$^2$, and ion implantation energy can be in a range of 40-60 KeV.

The first conduction type impurity layer 40 can reduce a junction potential barrier of the source to inhibit a drain depletion region from extending up to a source depletion region, thereby inhibiting reduction in a punch-through voltage. That is, the first conduction type impurity layer 40 inhibits reduction in a critical voltage that generates punch-through to prevent punch-through from occurring in a voltage range in which a semiconductor device performs a programming or erasing operation.

The second conduction type impurity layer 50 can be formed on the first conduction type impurity layer 40 formed in the pocket 30. In an embodiment, the second conduction type impurity layer 50 includes n-type impurities. In one embodiment, As$^+$ ions are implanted into the surface of the first conduction type impurity layer 40 to form the second conduction type impurity layer 50.

In the embodiment, the number of the second conduction type impurity ions contained in the second conduction type impurity layer 50 can be in a range of $1 \times 10^{15}$-$3 \times 10^{15}$ atoms/cm$^2$.

The insulating material 60 fills the pocket 30 and can include an oxide or a nitride.

Figure 2:
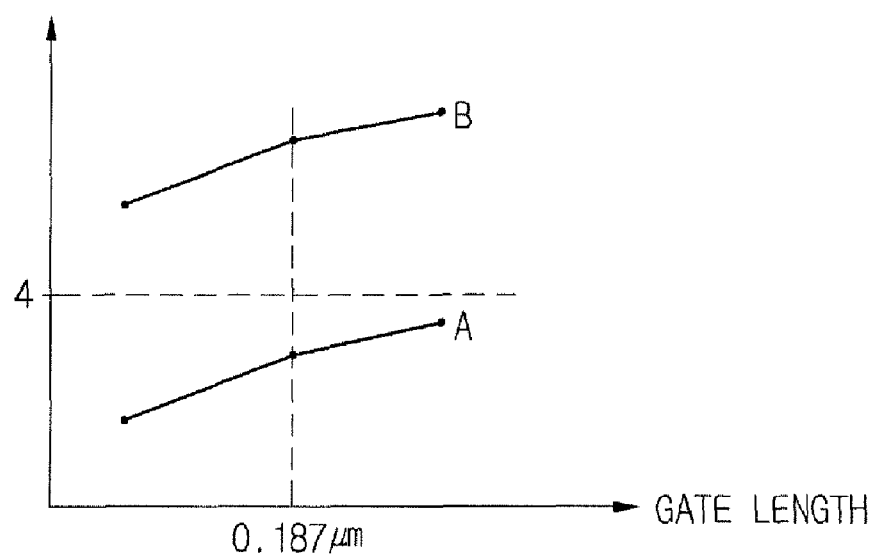
FIG. 2 is a graph illustrating punch-through voltage versus gate length of a semiconductor device according to an embodiment of the present invention.
Figure 3:
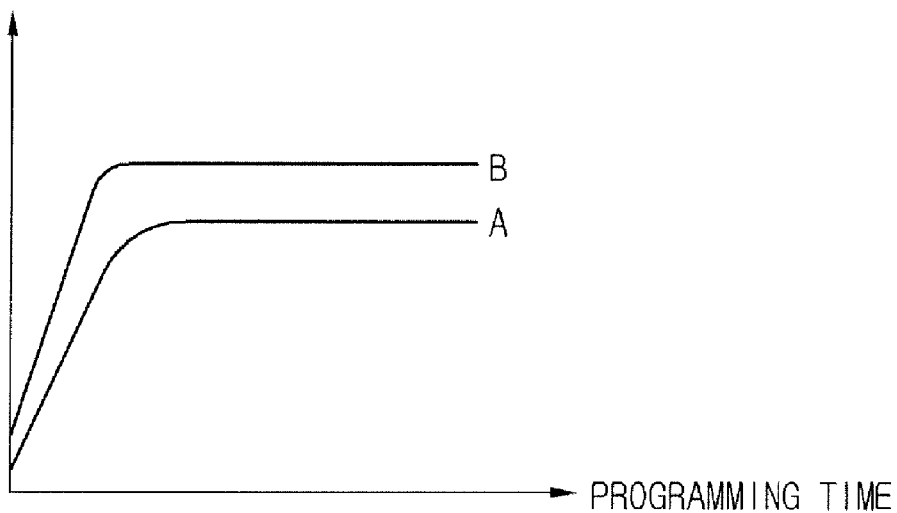
FIG. 3 is a graph illustrating programming voltage versus programming time of a semiconductor device according to an embodiment of the present invention.
Figure 4:
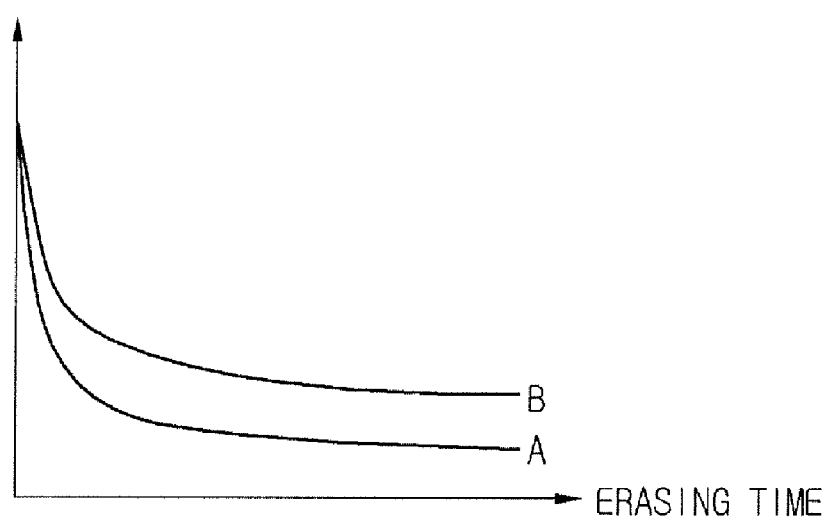
FIG. 4 is a graph illustrating erase voltage versus erase time of a semiconductor device according to an embodiment of the present invention and a related art.

FIG. 2 is a graph illustrating a punch-through voltage versus a gate length of a semiconductor device according to an embodiment. FIG. 3 is a graph illustrating a program voltage versus a program time of a semiconductor device according to an embodiment. FIG. 4 is a graph illustrating an erase voltage versus an erase time of a semiconductor device according to an embodiment.

A flash memory device according to an embodiment of the present invention, can be a NOR type flash memory. In operation, a flash memory cell performs a programming operation using channel thermal electron injection, and performs an erase operation through a source and a substrate using F-N tunneling.

Referring to FIG. 1 again, a programming operation of a flash memory cell is performed by storing electrons in the floating gate 24 to increase the threshold voltage of the flash memory cell by, for example, about 7 V from an initial threshold voltage. In detail, when about 9.5 V is applied to the control gate 28, about 4.2 V is applied to a drain, and 0 V is applied to the common source region and the substrate 10, some channel thermal electrons are stored in the floating gate 24 through the tunnel oxide layer pattern 22 by a gate electric field, so that the programming operation of the flash memory cell is performed.

Therefore, the programming operation can be performed on the condition that punch-through is not generated between the common source region and the drain region when about 4.2 V, more specifically, a maximum of 4.6 V, is applied to the drain of the flash memory cell.

Referring to FIG. 2, the graph A illustrates punch-through voltage versus gate length of a semiconductor device according to a related art, and the graph B illustrates punch-through voltage versus gate length of a semiconductor device according to an embodiment.

In FIG. 2, when a gate length of a semiconductor device according to the related art, and a gate length of a semiconductor device according to an embodiment are set to 0.187 µm, a punch-through voltage in the semiconductor device according to the related art is 4 V or less, and more accurately, about 3.8 V. That is, punch-through is generated at a voltage of 4 V or less in the semiconductor device according to the related art. Accordingly, when a voltage of about 4.2 V is applied to a drain of the related art flash memory cell for a programming operation, a programming operation characteristic is greatly reduced.

Meanwhile, in the case where the pocket 30 is formed, and the first conduction type impurity layer 40 and the second conduction type impurity layer 50 are formed in the pocket 30 according to an embodiment of the present invention, when the gate length is set to 0.187 µm, a punch-through voltage is 4 V or more, and more accurately, about 4.8 V. That is, punch-through is generated at about 5 V in a semiconductor device 100 according to an embodiment of the present invention. Accordingly, a programming operation characteristic is not influenced, even when a voltage of about 4.2 V is applied to a drain, during a programming operation of the semiconductor device 100 according to an embodiment of the present invention.

Referring to FIG. 3, the graph A illustrates programming voltage versus programming time in a semiconductor device according to a related art, and the graph B illustrates programming voltage versus programming time in a semiconductor device 100 according to an embodiment of the present invention. The programming voltage in the semiconductor device 100 according to the embodiment is about 0.7 V higher than that in the semiconductor device according to the related art, but a programming characteristic is substantially similar.

Referring to FIG. 1 again, an erasing operation of the flash memory cell is performed by discharging electrons stored in the floating gate 24 to lower the threshold voltage of the flash memory cell to the initial threshold voltage. To realize this, when the drain is floated, about 7.7 V is applied to the common source region and the substrate 10, and −9.1 V is applied to the control gate 28, the electrons stored in the floating gate 24 are discharged to the common source region due to an F-N tunneling effect through the tunnel oxide layer by a voltage difference between the floating gate 24 and the common source region, so that the erasing operation is performed.

FIG. 4 is a graph illustrating erase voltage versus erase time of a semiconductor device according to an embodiment and a related art. The graph A illustrates erase voltage versus erase time of a semiconductor device according to the related art, and the graph B illustrates erase voltage versus erase time of a semiconductor device 100 according to an embodiment of the present invention.

Referring to the graphs A and B of FIG. 4, an erasing voltage deviation in a predetermined erasing time of the semiconductor device according to the related art and the semiconductor device 100 according to the embodiment is about 0.5 V. Therefore, erasing characteristics of the semiconductor device according to the related art and the semiconductor device 100 according to the embodiment are substantially the same.

According to the foregoing, the pocket 30 can be formed in the common source region formed between a pair of the gate structures 20, and the first conduction type impurity layer 40 and the second conduction type impurity layer 50 can be formed in the pocket 30, so that the punch-through is not generated even when a voltage required for the programming operation and the erasing operation of the semiconductor device is applied to the drain. In addition, the programming characteristic and the erasing characteristic are not greatly influenced even when the first and second conduction type impurity layers are formed in the common source electrode. Accordingly, the characteristics of the semiconductor device are greatly improved.

FIGS. 5 to 9 are cross-sectional views for explaining a manufacturing method of a semiconductor device according to an embodiment of the present invention.

Figure 5:
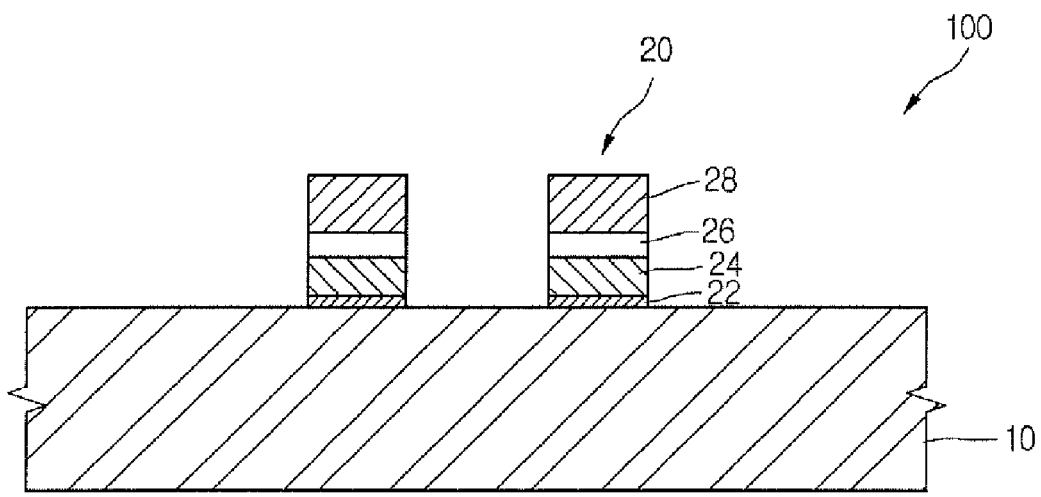
FIGS. 5 to 9 are cross-sectional views for explaining a manufacturing method of a semiconductor device according to an embodiment of the present invention.

Referring to FIG. 5, a pair of adjacent gate structures 20 can be formed on a substrate 10.

In an embodiment, the substrate 10 is a silicon substrate. To form the gate structures 20 on the substrate 10, a tunnel oxide layer can be formed on the substrate 10, a floating gate layer formed of polysilicon can be formed on the tunnel oxide layer, an ONO layer including an oxide layer-nitride layer-oxide layer can be formed on the floating gate layer, and a control gate layer formed of polysilicon can be formed on the ONO layer.

Subsequently, after the tunnel oxide layer, the floating gate layer, the ONO layer, and the control gate layer are formed, a photoresist film can be formed on the control gate layer and patterned to form photoresist patterns. The control gate layer, the ONO layer, the floating gate layer, and the tunnel oxide layer can be sequentially etched to form a tunnel oxide layer pattern 22, a floating gate 24, an ONO pattern 26, and a control gate 28, thereby forming a pair of the gate structures 20.

Figure 6:
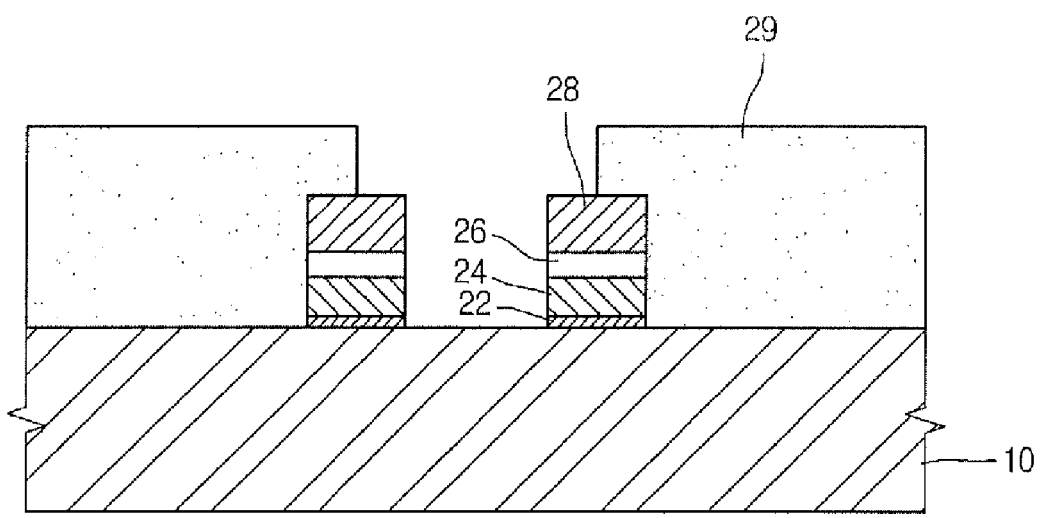

Referring to FIG. 6, after a pair of adjacent gate structures 20 is formed on the substrate 10, a mask pattern 29 exposing a portion between the gate structures 20 can be formed. In one embodiment, the mask pattern 29 exposes about half of the control gate 28 of the gate structure 20. In an embodiment, the mask pattern 29 can be, for example, a photoresist pattern.

Figure 7:
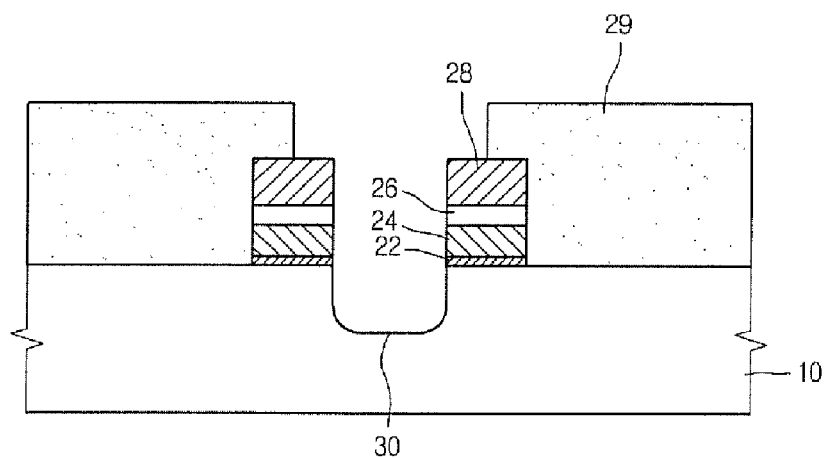

Referring to FIG. 7, after the mask pattern 29 is formed, a portion of the substrate 10 that is exposed through the mask pattern 29 can be etched using the mask pattern 29 as an etch mask, so that a pocket 30 is formed in the portion of the substrate 10 that is exposed through the mask pattern 29.

Figure 8:
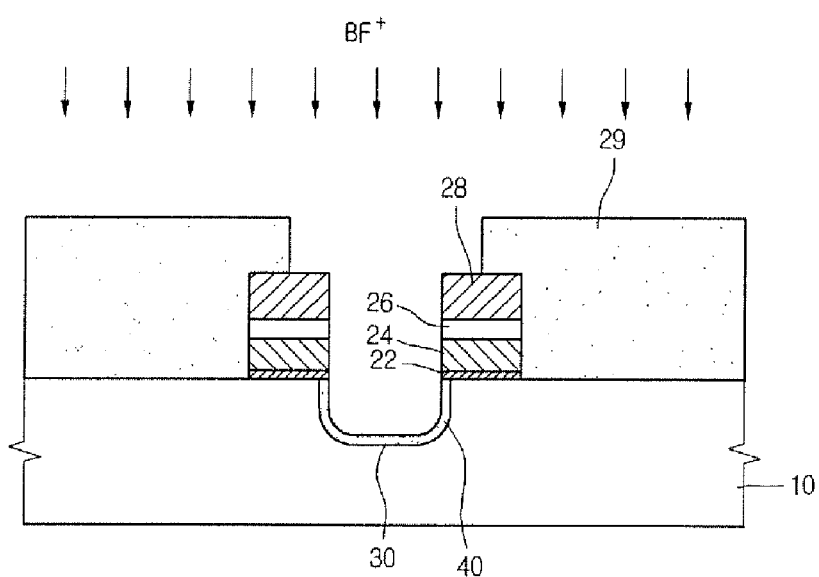

Referring to FIG. 8, after the pocket 30 is formed in the substrate 10, first conduction type impurities can be implanted at high concentration into the pocket 30 of the substrate 10 that is exposed by the mask pattern 29 using the mask pattern 29 as an ion implantation mask to form a first conduction type impurity layer 40. In an embodiment, the first conduction type impurities can be p-type impurities, for example, $BF^+$ ions. According to an embodiment, the first conduction type impurities are implanted in a direction substantially perpendicular to the surface of the substrate 10. The number of first conduction type impurities can be in a range of $4 \times 10^{15}$-$6 \times 10^{16}$ atoms/cm$^2$, and ion implantation energy can be in a range of 40-60 KeV.

After the first conduction type impurity layer 40 is formed in the pocket 30, the substrate 10 can be annealed through an annealing process to recover a damage of the substrate 10 and thermally diffuse the first conduction type impurities.

Figure 9:
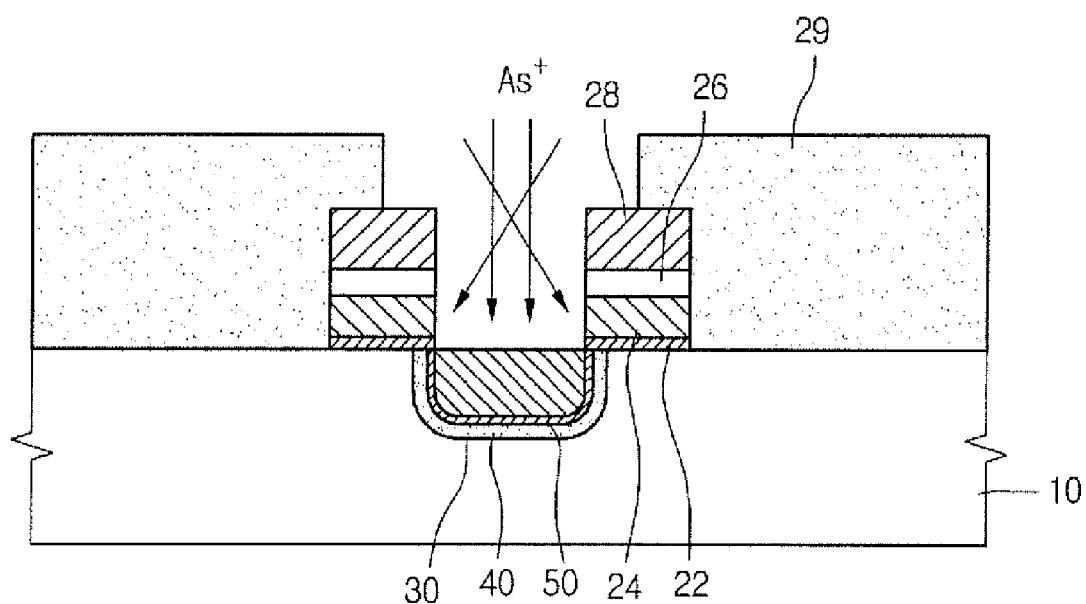

Referring to FIG. 9, after the first conduction type impurity layer 40 is formed in the pocket 30, second conduction type impurities can be implanted at high concentration into the pocket 30 of the substrate 10 that is exposed by the mask pattern 29 using the mask pattern 29 as an ion implantation mask to form a second conduction type impurity layer 50. In an embodiment, the second conduction type impurities can be p-type impurities, for example, $As^+$ ions. According to an embodiment, the second conduction type impurities are implanted in a direction inclined with respect to the surface of the substrate 10. The number of second conduction type impurities can be in a range of $1 \times 101^5$-$3 \times 10^{15}$ atoms/cm$^2$, and ion implantation energy can be in a range of 10-30 KeV.

Referring to FIG. 1 again, after the second conduction type impurity layer 60 is formed in the pocket 30, an insulating material 60, which can be an oxide or a nitride, is disposed in the pocket 30, and the mask pattern 29 is removed.

According to the foregoing description, impurities having a type opposite to that of source junction impurities can be implanted into the pocket formed between the gate structures to solve a punch-through limitation, so that potential barrier at a source junction is reduced. Consequently, punch-through generated between a source and a drain can be inhibited, and a stable programming operation and a swift erasing operation can be performed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosed, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. A method for manufacturing a semiconductor device, the method comprising:
   forming a pair of adjacent gate structures on a substrate;
   forming mask patterns exposing a portion of the substrate located between the gate structures;
   etching the portion of the substrate located between the gate structures using the mask patterns as an etch mask to form a pocket;
   implanting first conduction type impurities into the pocket to form a first conduction type impurity layer in a surface of the pocket;
   implanting second conduction type impurities into the pocket to form a second conduction type impurity layer on the first conduction type impurity layer; and
   filling the pocket with an insulating material.

2. The method according to claim 1, wherein the first conduction type impurities are p type impurities, and the second conduction type impurities are n type impurities.

3. The method according to claim 2, wherein the first conduction type impurities comprise $BF^+$ ions.

4. The method according to claim 2, wherein the second conduction type impurities comprise $As^+$ ions.

5. The method according to claim 1, wherein the first conduction type impurities are implanted into the pocket in a direction perpendicular to the substrate, and the second conduction type impurities are implanted into the pocket in a direction inclined with respect to the substrate.

6. The method according to claim 1, wherein the first conduction type impurities are implanted in a range of $4 \times 10^{15}$-$6 \times 10^{16}$ atoms/cm$^2$, at an ion implanting energy in a range of 40-60 KeV, and the second conduction type impurities are implanted in a range of $1 \times 10^{15}$-$3 \times 10^{15}$ atoms/cm$^2$ at an ion implanting energy in a range of 10-30 KeV.

7. The method according to claim 1, further comprising, after forming the first conduction type impurity layer, performing an annealing process to recover a damage of the substrate and thermally diffuse the first conduction type impurities.

8. The method according to claim 1, wherein forming the pair of the adjacent gate structures comprises:
- forming a tunnel oxide layer on the substrate, a floating gate layer on the tunnel oxide layer, an ONO layer on the floating gate layer, and a control gate layer on the ONO layer;
- forming a photoresist pattern on the control gate layer;
- sequentially etching the tunnel oxide layer, the floating gate layer, the ONO layer, and the control gate layer using the photoresist pattern as an etch mask to form the gate structures including a tunnel oxide layer pattern, a floating gate, an ONO pattern, and a control gate.

9. The method according to claim 8, wherein the mask pattern exposes at least portions of upper surfaces of the gate structures.

* * * * *